United States Patent
Bollman et al.

(10) Patent No.: US 9,718,215 B2
(45) Date of Patent: Aug. 1, 2017

(54) CAPACITIVE CLAMPING PROCESS FOR CLEAVING WORK PIECES USING CRACK PROPAGATION

(71) Applicant: Halo Industries, Inc., Menlo Park, CA (US)

(72) Inventors: Andrew Bollman, San Francisco, CA (US); Andrei Iancu, Menlo Park, CA (US); Philip Van Stockum, San Francisco, CA (US)

(73) Assignee: Halo Industries, Inc., Menlo Park, CA (US)

( * ) Notice: Subject to any disclaimer, the term of this patent is extended or adjusted under 35 U.S.C. 154(b) by 113 days.

(21) Appl. No.: 14/687,819

(22) Filed: Apr. 15, 2015

(65) Prior Publication Data

US 2016/0303764 A1    Oct. 20, 2016

(51) Int. Cl.
  *B28D 5/00* (2006.01)
  *H01L 21/78* (2006.01)
  *B26F 3/00* (2006.01)

(52) U.S. Cl.
  CPC .......... *B28D 5/0011* (2013.01); *B26F 3/002* (2013.01); *B28D 5/0023* (2013.01); *H01L 21/78* (2013.01)

(58) Field of Classification Search
  CPC ......... B28D 5/00; B28D 5/0011; H01L 21/78; B26F 3/00
  See application file for complete search history.

(56) References Cited

U.S. PATENT DOCUMENTS

| | | | |
|---|---|---|---|
| 3,901,423 A | 8/1975 | Hillberry et al. | |
| 4,184,188 A | 1/1980 | Briglia | |
| 4,480,284 A | 10/1984 | Tojo et al. | |
| 6,272,002 B1 | 8/2001 | Mogi et al. | |
| 2009/0056513 A1 | 3/2009 | Baer | |
| 2009/0277314 A1 | 11/2009 | Henley | |
| 2013/0126573 A1* | 5/2013 | Hosseini | B23K 26/0057 225/2 |
| 2015/0060509 A1 | 3/2015 | Iancu et al. | |

OTHER PUBLICATIONS

PCT International Search Report and Written Opinion, PCT Application No. PCT/US2016/025447, Jun. 23, 2016, 13 pages.

* cited by examiner

*Primary Examiner* — Mohammad Choudhry
(74) *Attorney, Agent, or Firm* — Fenwick & West LLP (57) ABSTRACT

Controllable cleavage of a work piece is achieved through the use of capacitive clamps and application of a large tensile force. Capacitive clamps are used to secure the ends of a work piece with strong electrostatic forces. The capacitive clamps secure the ends of the work piece by creating electrostatic forces like those experienced by the plates in a parallel plate capacitor. After introduction of a crack along a side surface of the work piece, the application of a tensile force along the central axis of the work piece causes the crack to rapidly propagate and cleave the work piece into two or more pieces.

31 Claims, 6 Drawing Sheets

CAPACITIVE CLAMPING PROCESS FOR CLEAVING WORK PIECES USING CRACK PROPAGATION

BACKGROUND

This invention relates generally to material processing, and more specifically to cleaving material work pieces through crack propagation.

Semiconductors are an important and valuable material in the electronics and photovoltaics industries due to their unique properties, versatile applications and now widespread use. Semiconductors are often used in wafer form. However, current wafer fabrication methods are wasteful and can result in up to 50% material loss. Mechanical wire sawing of large semiconductor ingots/blocks into the thin wafer form is the industry standard, but kerf loss caused by the saw wire is inevitable. Sawing also damages the surface of the resultant wafers, leading to a need for damaged material removal and subsequent surface finishing to achieve the high-grade wafers that are required for many applications. Polishing and mechanical grinding are often used to finish the surfaces of wafers, and these post-processing steps remove even more material from the wafers, further increasing the overall material loss. High material loss during the manufacturing of semiconductor wafers results in less semiconductor material that can be used for applications and higher cost per wafer.

Cleaving material work pieces via crack propagation is a promising alternative to current wafer processing methods because it results in little material loss. Further, it is seen that this type of cleaving results in higher quality wafer surfaces, potentially reducing or eliminating the need for post-processing steps to achieve high-quality surface finishes. However, producing wafers through such cleavage methods comes with challenges of its own. Particularly, controlling the propagation of the crack with the precision that is necessary to create high-quality wafers can be difficult. Additionally, current processes exploring this method have low throughput and high cost and are thus not suitable for mass production.

SUMMARY

Various embodiments of an apparatus for cleaving a work piece include capacitive clamps for securing one or more end faces of a work piece. The capacitive clamps secure the end faces of the work piece by creating electrostatic forces like those experienced by the plates in a parallel plate capacitor. By oppositely polarizing a conductive body of the capacitive clamp and the work piece while they are separated by a non-conductive layer that does not let charge migrate, opposite charges build up on the surfaces of the conductive body and the work piece and attract. A crack is separately introduced along a side surface of the work piece, either before or after the work piece is secured to the clamps. A tensile force is then applied to pull the capacitive clamps and work piece to produce a tensile stress within the work piece that is sufficient to cause the crack to propagate rapidly and cleave the work piece into two. This process can then be repeated to cleave additional pieces from the main work piece. This cleaving mechanism avoids the material loss and damage caused by previous techniques, while enabling repeatable, high-throughput, precise, and controllable cleavage of a work piece.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

System Overview

Figure 1:
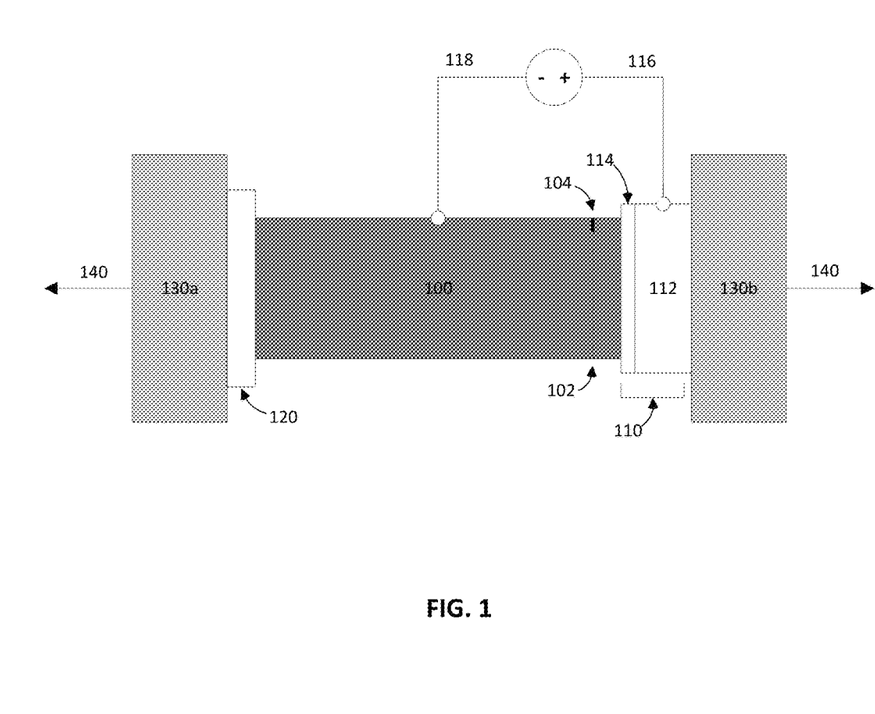
FIG. 1 illustrates a system for cleaving a work piece through the use of a capacitive clamp, according to one embodiment.

FIG. 1 illustrates a system for cleaving a work piece through the use of a capacitive clamp, according to one embodiment. A work piece 100 has two ends that are connected by one or more side surfaces. Each end can have an end face. One end face of the work piece 100 is secured to support 130*b* by a capacitive clamp 110, while an opposite end of the work piece issecured to support 130*a* by a mechanical clamp 120. The capacitive clamp 110 includes a conductive main body 112 and a non-conductive layer 114. When a positive voltage 116 is applied to the conductive main body 112 and a negative voltage or ground 118 is applied to the work piece 100, the non-conductive layer 114 prevents charge from being transferred between the conductive main body 112 and the work piece 100. This results in an attractive electrostatic force between the conductive main body 112 and the work piece 100, securing the work piece 100 to the capacitive clamp 110. A side surface of work piece 100 also has a crack 104 along an intended plane of fracture 102. By mechanically applying a tensile force 140 along the central axis of the work piece 100, normal to the intended plane of fracture 102, while the ends of the work piece 100 are secured by the capacitive clamp 110 and the mechanical clamp 120, the crack 104 propagates along the intended plane of fracture 102 to cleave the work piece 100 into two pieces. Due to the applied voltages during the cleavage, the cleaved piece of the work piece 100 is still in contact with the capacitive clamp 110 and thus remains charged and strongly attracted to the capacitive clamp 110 after cleavage.

In some embodiments, the mechanical clamp 120 is replaced by another capacitive clamp 110. Thus, both ends of the work piece 100 are secured by electrostatic forces. A positive voltage 116 is applied to the conductive main bodies 112 of both capacitive clamps 110, while a negative voltage or ground 118 is applied to the work piece 100. Alternatively, the negative voltage or ground 118 can be applied to conductive main bodies 112 of both capacitive clamps 110, and the positive voltage 116 can be applied to the work piece 100. These voltages may be applied by a single voltage source or separate voltage sources.

In some embodiments, the system also includes a structure and mechanism for collecting the cleaved piece. For example, after cleaving, a small opposite voltage can be applied to the conductive main body 112 to create a small repulsive force between the cleaved piece and the conductive main body 112 that can push the cleaved piece off of the capacitive clamp 110. The cleaved piece may then fall or be placed into a collector. Additionally, the system may have a mechanism to reposition the work piece 100, or "reset" itself, so that the newly-cleaved surface of the work piece 100 can be secured to the capacitive clamp 110 and the cleaving process can be repeated. Depending on the embodiment, this mechanism may be manual or automatic.

Some embodiments of the system are able to additionally secure the body of the work piece 100 at positions between the capacitive clamp 110 and the crack 104. This additional securement away from the intended plane of fracture 102 is to prevent work piece 100 from fracturing at a location other than the crack 104. Additionally, some embodiments of the system continue processing, manually or automatically, if the cleavage of the work piece 100 fails and the work piece 100 breaks unintentionally. For example, the system may eject a broken work piece 100 and replace it with a new work piece 100. Alternatively, the system may incorporate standard tools known in the art to resurface the broken work piece 100 such that processing can continue.

Capacitive Clamp

A capacitive clamp 110 includes a non-conductive layer 114 and a conductive main body 112. The non-conductive layer 114 is proximate to one face of the conductive main body 112. In some embodiments, the non-conductive layer 114 is deposited directly onto the face of the conductive main body 112 such that they are chemically adhered. In many embodiments, the other face of the conductive main body 112 is secured to some sort of support 130. This can be done by any suitable means for mechanically or chemically fastening or attaching the two materials. If the support 130 is made of metal or another conductive material, using a non-conductive method of attachment prevents the voltage that is applied to the conductive main body 112 from also being applied to the support 130 and potentially causing a short-circuit or some other harm. In particular, the conductive main body 112 may be secured to a conductive support 130 using a non-conductive epoxy. In some embodiments, the shape of the capacitive clamp 110 matches the cross-sectional geometry of the work piece 100.

The capacitive clamp 110 secures an end face of the work piece 100 by creating electrostatic forces like those experienced by the plates of a parallel plate capacitor. A voltage supply is used to energize the conductive main body 112 to a high voltage, while the work piece 100 is either energized to the opposite polarity or grounded. Additionally, the non-conductive layer 114 prevents any charge from passing from the conductive main body 112 to the work piece 100, and vice versa. Thus, charges gather at the nearest surfaces of both the conductive main body 112 and the work piece 100. Because these charges are opposite and thus attract, an electric field is created within the non-conductive layer 114 and an electrostatic force is created.

Though the strength of the electrostatic force necessary to secure the work piece 100 to the capacitive clamp 110 can vary, the applied compressive stress is usually on the order of $10^6$ to $10^8$ Pa. This stress is typically created by applying voltages from the range, including but not limited to, of 100 V to 500 kV, depending on the thickness and dielectric properties of the non-conductive layer 114. For example, a 100 V bias applied across a 100 nm thick $HfO_2$ non-conductive layer 114 will generate a compressive stress of approximately $10^8$ Pa. Similarly, a 500 kV bias applied across a 500 μm thick quartz non-conductive layer 114 will generate a compressive stress of approximately $10^7$ Pa. Fracture mechanics analyses indicate that the stress necessary to propagate crack 104 is primarily dependent on the initial crack depth. Flexibility in the depth of initial crack 104 results in flexibility in the required electrostatic force and hence required voltage 116 for propagation.

The finish of the surface of the capacitive clamp 110 can affect the strength and uniformity of the electrostatic force between the capacitive clamp 110 and the work piece 100. Because air has a lower dielectric constant than the materials used for the non-conductive layer 114, air gaps between the work piece 100 and the non-conductive layer 114 can reduce the electric field present between the work piece 100 and the conductive main body 112 and thus reduce the resultant electrostatic force. Additionally, random placement of air gaps can affect the uniformity of the electric field between the conductive main body 112 and the work piece 100, resulting in a less uniform electrostatic force. To reduce these effects, the contact surface of the non-conductive layer 114 can be made as atomically flat as possible (e.g., using methods like polishing) to reduce the presence of air between the capacitive clamp 110 and the work piece. Polishing can also be used to prevent damage to the work piece 100 if the material used for the non-conductive layer 114 is harder than the work piece 100. In some embodiments, the surface finish depends on the materials used for the conductive main body 112 and the non-conductive layer 114. In some embodiments, the conductive main body 112 is made out of a semiconducting material.

The material used for the non-conductive layer 114 may affect the operation of the capacitive clamp 110 due to the magnitude of the electrostatic force required to cleave the work piece 100. For the capacitive clamp 110 to function like a capacitor, the non-conductive layer 114 must be a dielectric material. The magnitude of electric field at which these materials breakdown, or lose their insulating properties, is known as dielectric strength. Because the electric field experienced by the non-conductive layer 114 is proportional to the electrostatic force produced by the capacitive clamp 110, it is advantageous to use a material with a high dielectric strength. Materials that have been found to be capable of withstanding the necessary magnitudes of electric fields are diamond, cubic boron nitride, aluminum nitride, hafnium oxide, silicon oxide, silicon nitride, barium titanate, strontium titanate, lithium niobate, aluminum oxide, calcium fluoride, silicon carbide, and any combination thereof. However, this list is not limiting, as it is feasible that other materials with similarly high dielectric strengths would also work for this purpose. A secondary dielectric material consideration is dielectric constant. Higher values of dielectric constant result in lower voltages, and hence electric fields, that need to be applied to achieve the same magnitude electrostatic forces. The ideal material used for the non-conductive layer 114 is therefore one with both high dielectric strength and high dielectric constant.

In some embodiments, the dielectric material used for the non-conductive layer 114 is coated with a thin layer of a different material. If the dielectric material is too hard and causes damage to the work piece 100 during clamping, the thin layer coating can be of a softer dielectric material that does not damage the work piece 100. If the dielectric is too soft and incurs damage during clamping, the thin layer coating can be a harder dielectric material that better withstands the forces associated with clamping.

Mechanical Tensile Force

The mechanical tensile force 140 used to cleave the work piece 100 is applied along the central axis of the work piece 100, normal to the intended plane of fracture 102, to propagate the crack 104 along the intended plane of fracture 102. The tensile force 140 can be applied by any known method of creating a force along an axis. Examples include, but are not limited to, use of hydraulic power, screws that can generate linear motion (i.e., roller screws, lead screws), inertial transfer (i.e., flywheel and clutch), thermally expanding materials (i.e., nitinol, water), and solenoid-like electromagnetic induction. Additionally, a laser or similar alignment system can be used to ensure that there is proper alignment between the work piece 100 and the capacitive clamp 110 such that the tensile force 140 is applied along the central axis of the work piece 100.

The work piece 100 is secured to the capacitive clamp 110 to achieve successful cleavage of the work piece 100. If the end face of the work piece 100 that should interface with the capacitive clamp 110 is not perpendicular to the central axis of the work piece 100, the capacitive clamp 110 may not be able to successfully secure the work piece 100. In one embodiment, the capacitive clamp 110 includes a spherical bearing that can withstand the large tensile force 140 experienced during cleaving. The spherical bearing can passively adjust the capacitive clamp 110 against the end face of the work piece 100 as they are brought into contact. Alternatively, three or more hydraulic cylinders can be attached to the spherical bearing to actively tilt the capacitive clamp 110 to match the end face of the work piece 100. The latter system can use a feedback loop involving computer vision, laser measurements or force gauges to accurately adjust the capacitive clamp 110.

In some embodiments, the components or the entirety of the capacitive clamp 110 is readily removable, so as to allow for easy maintenance and replacement. For example, if the dielectric material used for the non-conductive layer 114 wears out easily, there may be some mechanism or process for removing the damaged non-conductive layer 114 and replacing it with a new non-conductive layer 114. If the non-conductive layer 114 is not chemically bonded to the conductive main body 112, it may be fastened onto said main body using any mechanical method, such as bolts, epoxy, spring-loaded pins, retaining collar and so forth that can be easily removed to allow replacement. If the non-conductive layer 114 is chemically bonded to the conductive main body 112, the entire capacitive clamp 110 may be readily removable from support 130b such that the non-conductive layer 114 can be subsequently chemically or mechanically removed and replaced allowing for reuse of the majority of the capacitive clamp 110 components.

Work Piece

Though this system is particularly applicable to semiconductor manufacturing, the work piece 100 can be made of materials other than a semiconducting material. In various embodiments, the work piece 100 should be conductive such that charge can flow to the surface of the work piece 100 that mates with the capacitive clamp 110 when opposite voltages are applied to the work piece 100 and the conductive main body 112. Examples of work piece 100 materials that meet these requirements include many semiconductors, like silicon, germanium, gallium arsenide and gallium nitride. If the material used for the work piece 100 is not conductive enough to meet those requirements, no electrostatic force will be generated, and the capacitive clamp 110 will be unable to secure the work piece 100. However, those properties can be achieved with a work piece 100 made of an insulating material by applying a thin conductive coating that is strongly-bonded to the surface of the insulating material. To be considered strongly-bonded, the thin conductive coating must be able to stay bonded to the surface of the insulating material during the application of the electrostatic and tensile forces used in this process. Many techniques to achieve such a coating are known in art and include, but are not limited to, chemical vapor deposition, atomic layer deposition, diffusion doping, implant doping, sputtering, and electron beam deposition.

Because the system more readily achieves cleavage along crystallographic planes, the crystallinity of the work piece 100 may be a factor in designing the system. A single-crystalline work piece 100 may be beneficial in some instances because the tensile force 140 needed to propagate the crack 104 along the intended plane of fracture 102 stays constant throughout such a material. Polycrystalline and non-crystalline materials can also be cleaved in this manner, though the propagation of crack 104 may be more difficult to control and keep along the intended plane of fracture 102, and consequently the cleaved surfaces may exhibit increased roughness.

For crystalline materials, the crystal orientation of the work piece 100 with respect to the intended plane of fracture 102 can affect the force needed to cleave the work piece 100 as well as the quality of the cleaved surfaces. In general, the force that is required to cleave the work piece 100 depends on the number and type of molecular bonds that must be broken to form the cleaved surfaces, which varies based on the alignment of the intended plane of fracture 102 with the crystal lattice of the material used for the work piece 100. For example, cleaving along the (111) crystallographic plane of silicon requires less force than cleaving along other planes because the (111) silicon surface has the lowest density of atomic bonds that must be broken. The intended plane of fracture 102 determines the crystal orientation of resultant wafers. In many embodiments, the intended plane of fracture 102 is aligned with the crystal orientation of the work piece 100. Thus, the crystal orientation of the resultant wafers is the same as the crystal orientation of the work piece 100. Standard crystal orientations for crystalline silicon include (100), (111), and (110).

If the intended plane of fracture 102 is not perfectly aligned with a crystallographic plane, the work piece 100 may cleave along multiple crystallographic planes throughout the length of the cleavage, resulting in fewer atomically smooth cleaved surfaces. Additionally, if the tensile force 140 applied to the work piece 100 is less than the force necessary to cleave the work piece 100 along the crystallographic plane most closely aligned with the intended plane of fracture 102, the work piece 100 may cleave along crystallographic planes that require less force to cleave, resulting in undesired cleaved surfaces.

To help the capacitive clamp 110 create as highly uniform of an electrostatic force as possible, the faces of the work piece 100 that come into contact with the capacitive clamp 110 can be as atomically flat as possible. Additionally, the faces of the work piece 100 can be parallel to the intended plane of fracture 102 so that the resultant electrostatic force from the capacitive clamp 110 is antiparallel to the tensile force 140.

The shape of the work piece 100 can be selected based on the desired shape of the cleaved pieces. Some examples include work pieces with a circular, rectangular, square or pseudo-square cross-sectional area to produce wafers of that same shape. For the formation of commercially-viable wafers, adhering to industry standards may be preferable. For example, 4 inch circular wafers are a standardized, commonly used type of wafer, so the work piece 100 used to form those wafers would be cylindrical with a cross-sectional area of a circle with a 4-inch (or 100-millimeter) diameter. Other standard diameters for circular wafers include 1 inch (25 millimeters), 2 inches (51 millimeters), 3 inches (76 millimeters), 5.9 inches (150 millimeters), 7.9 inches (200 millimeters), 11.8 inches (300 millimeters), and 17.7 inches (450 millimeters). Standard side lengths for pseudo-square wafers include 125 millimeters, 156 millimeters, and 200 millimeters. Additionally, the work piece 100 may include notches or flats according to industry standards. These features indicate the orientation of the crystal structure of the single-crystalline material. For example, an n-doped (100) silicon wafer has two flats that are parallel to each other, and could be made from a work piece 100 that is cylindrical with two parallel flats cut on opposite sides of the length of the cylinder.

Crack Formation

As described above, the crack 104 initiates cleavage through crack propagation when a tensile force 140 is applied across the work piece 100. The crack 104 can be introduced through methods including but not limited to laser cutting, mechanical scribing, patterned chemical wet etching and ion bombardment dry etching. Other methods known in the art for introducing small cracks into a work piece may also suffice. The placement of the crack 104 determines the thickness of the resultant cleaved piece. For example, if the crack 104 is placed 0.500 mm away from an end face of the work piece 100 that is attached to the capacitive clamp 110, the resultant wafer will be approximately 0.500 mm thick. In this fashion, wafers of any thickness may be produced with the only limitation being that the width of the initial crack 104 must be significantly smaller than the desired wafer thickness.

The width, depth, length and shape of the crack 104 can be varied to control the crack propagation dynamics and the quality of the cleaved surfaces. The width of the crack 104 may be dependent on the method by which the crack 104 is created. In some embodiments, it is desirable to minimize the width of the crack 104 in order to increase the accuracy of crack propagation along the intended plane of fracture 102 and to maximize control over the resultant wafer's thickness. In one embodiment, the depth of the crack 104 is based on the fracture toughness of the work piece 100 and the maximum magnitude of electrostatic force that can be applied by the capacitive clamp 110. In some embodiments, the shape of the crack 104 is controlled to produce a sharp cusp geometry at the deepest point in order to maximize the stress concentration factor at that location and facilitate crack propagation.

The crack 104 can be introduced to the work piece 100 before the work piece 100 is secured in the clamps 110 and 120. Alternatively, the crack 104 can be introduced after the work piece 100 is secured in the clamps 110 and 120 in order to place the crack 104 with more accuracy. For example, a tool that creates the crack 104 can be calibrated with respect to the capacitive clamp 110, resulting in a more accurate measurement of position in relation to the end face of the work piece 100 in contact with the capacitive clamp 110. In some embodiments, introduction of the initial crack 104 after the work piece 100 is secured in the clamps 110 and 120 allows for more effective removal of debris generated by the crack formation process thereby preventing said debris from affecting the proper mating of the clamps and work piece.

Figure 2:
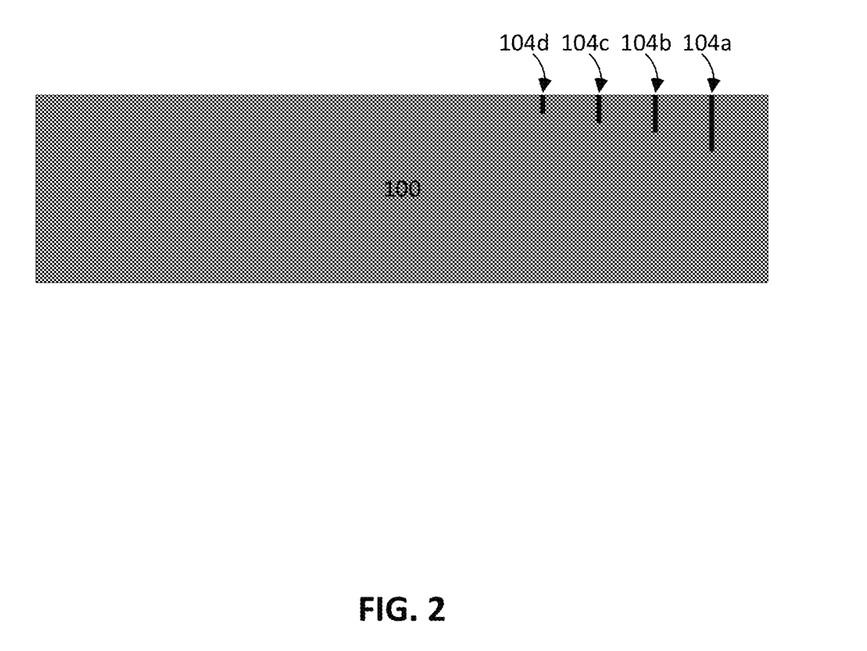
FIG. 2 illustrates a work piece with multiple cracks, according to one embodiment.

In some embodiments, multiple cracks 104 are introduced to the work piece 100. FIG. 2 illustrates an exemplary work piece 100 with multiple cracks 104, according to one embodiment. The work piece 100 has cracks 104*a*, 104*b*, 104*c* and 104*d*, which are of varying lengths. Crack 104*a* is the longest crack 104, followed by crack 104*b*, then crack 104*c*, then crack 104*d*, which is the shortest crack 104. The cracks 104 are of the shown lengths to promote the serial cleavage of the work piece based on the multiple cracks 104. The longest crack 104*a* is closest to the end face of the work piece 100 that would be secured by the capacitive clamp 110 so that when the tensile force 140 is applied to the work piece only the longest crack 104*a* propagates through the work piece 100, creating only one cleaved piece. Then, the system can be reset, and the newly-cleaved surface that was initially crack 104*a* can be secured to the capacitive clamp 110 and the process can repeat until the rest of the cracks 104 have cleaved through the work piece 100 one at a time.

Exemplary Systems

Figure 3:
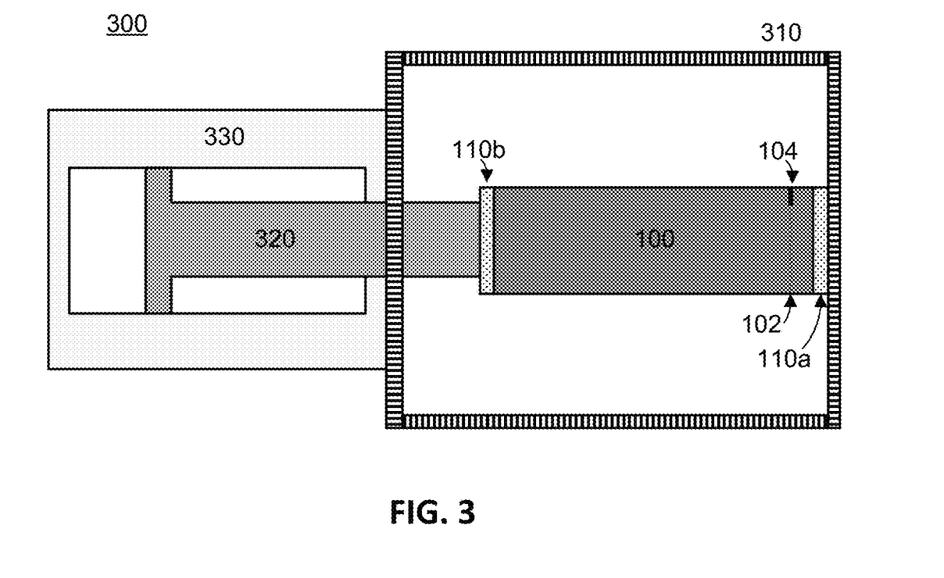
FIG. 3 illustrates a system for cleaving a work piece through the use of capacitive clamps with a single hydraulic cylinder and a single frame, according to one embodiment.

FIG. 3 illustrates an exemplary system 300 for cleaving a work piece 100 through the use of capacitive clamps 110 with a single hydraulic cylinder and a single frame, according to one embodiment. The system 300 includes a fixed frame 310, which may be rectangular in shape. The fixed frame 310 has a capacitive clamp 110*a* mounted on the interior of one side and a cylinder 330 mounted on the exterior of the opposite side. The interior of the cylinder 330 couples with a rod 320 to form a complete hydraulic cylinder. In some embodiments, the cylinder 330 and rod 320 are long enough such that the stroke of the hydraulic cylinder can accommodate the work piece 100 as it shrinks to its minimum workable size. The rod 320 is attached to another capacitive clamp 110*b*. The work piece 100 is secured on both ends by the capacitive clamps 110*a* and 110*b*.

To apply the tensile force 140 necessary for cleavage of the work piece 100, the rod 320 is moved toward the back of the cylinder 330 by hydraulic forces. During this movement, both the cylinder 330 and the capacitive clamp 110*a* stay fixed because they are attached to the fixed frame 310. The rod 320 pulls the capacitive clamp 110*b* away from the capacitive clamp 110*a*, putting the work piece 100 under tension, which creates the tensile force 140. The hydraulic cylinder can also be used to position the work piece 100, particularly after the cleaved piece has been removed and the newly-cleaved surface of the work piece 100 needs to be attached to the capacitive clamp 110*a* in order to repeat the cleaving process.

Figure 4:
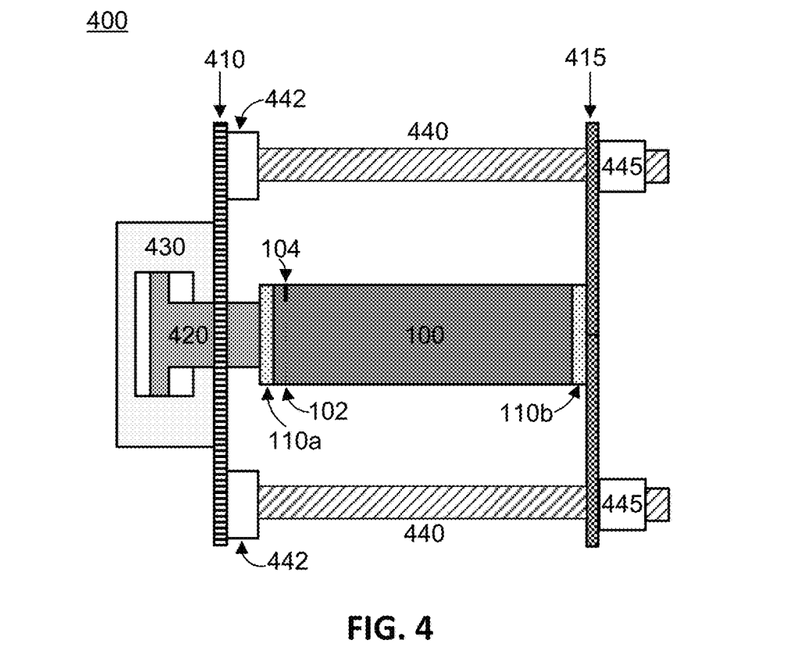
FIG. 4 illustrates a system for cleaving a work piece through the use of capacitive clamps with a single hydraulic cylinder, multiple screws and a single frame, according to one embodiment.

FIG. 4 illustrates an exemplary system 400 for cleaving a work piece 100 through the use of capacitive clamps 110 with a single hydraulic cylinder, multiple screws and a single frame, according to one embodiment. The system 400 includes a frame that has a fixed portion 410 and a moveable portion 415 that are parallel to each other. Screws 440 are attached to both the fixed portion 410 and moveable portion 415 of the frame and may be any type of screw that functions in the manner described. For example, the screws 440 may be lead screws. One end of each screw 440 is mounted on the fixed portion of the frame 410 with thrust bearings 442 so that the screw 440 can still freely spin without torquing the fixed portion of the frame 410. The other end of each screw 440 goes through the moveable portion of the frame 415 and a reciprocal nut 445 that is mounted to the moveable portion of the frame 415 but remains free with respect to the moveable portion of the frame 415. Thus, when the free end of the screw 440 is torqued, the moveable portion of the frame 415 moves closer to the fixed portion of the frame 410. This motion can be used to position the work piece. The fixed portion of the frame 410 is additionally attached to a cylinder 430 that couples with one end of a rod 420 to operate as a hydraulic cylinder. The other end of the rod 420 is attached to a capacitive clamp 110a. Another capacitive clamp 110b is attached to the moveable portion of the frame 415.

During the cleavage process, the work piece 100 is secured between the fixed portion 410 and the moveable portion 415 of the frame by capacitive clamps 110a and 110b. The hydraulic cylinder applies the tensile force 140 by using hydraulic forces to pull the rod 420 toward the back of the cylinder 430, while the moveable portion of the frame 415 remains stationary. This is similar to the motion described with respect to the hydraulic cylinder creating the tensile force 140 in system 300 of FIG. 3. In this case, because the hydraulic cylinder is not used for positioning the work piece 100, the length of the cylinder 430 and rod 420 only needs to be as long as is needed to apply the tensile force 140 to the work piece 100. The screws 440 stay fixed while the tensile force 140 is applied, and are only used to position the work piece 100 by moving the movable portion of the frame 415 as necessary. Thus, the screws 440 should be long enough to accommodate the entire length of the work piece 100.

Figure 5:
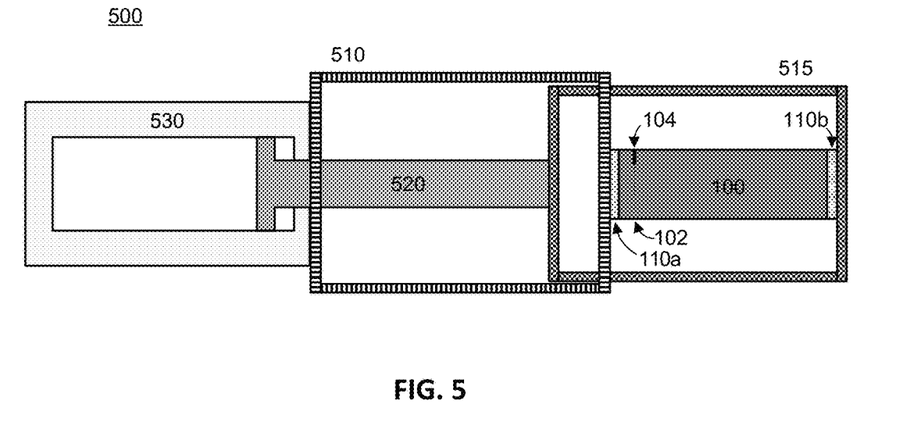
FIG. 5 illustrates a system for cleaving a work piece through the use of capacitive clamps with a single hydraulic cylinder and multiple frames, according to one embodiment.

FIG. 5 illustrates an exemplary system 500 for cleaving a work piece 100 through the use of capacitive clamps 110 with a single hydraulic cylinder and multiple frames, according to one embodiment. The system 500 includes a fixed frame 510 and a moveable frame 515. A cylinder 530 and a capacitive clamp 110a are attached to the exterior of opposite sides of the fixed frame 510, while a rod 520 and a capacitive clamp 110b are attached to the exterior and interior, respectively, of opposite sides of the moveable frame 515. Again, the rod 520 couples with the cylinder 530 to operate as a hydraulic cylinder, and the work piece 100 is held between the two capacitive clamps 110a and 110b. Similarly to system 300 of FIG. 3, the hydraulic cylinder is used to both create the tensile force 140 and position the work piece 100, and the cylinder 530 and rod 520 are sufficiently long to accommodate the maximum workable size of the work piece 100. Unlike the system 300 of FIG. 3, the hydraulic cylinder is used to apply a pushing force rather than a pulling force.

Figure 6A:
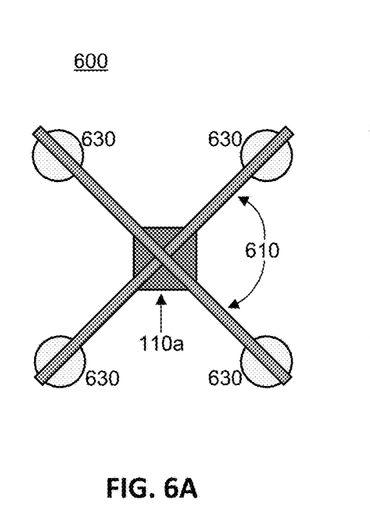
FIGS. 6A and 6B illustrate a system for cleaving a work piece through the use of capacitive clamps with multiple hydraulic cylinders, multiple screws and a single frame, according to one embodiment.
Figure 6B:
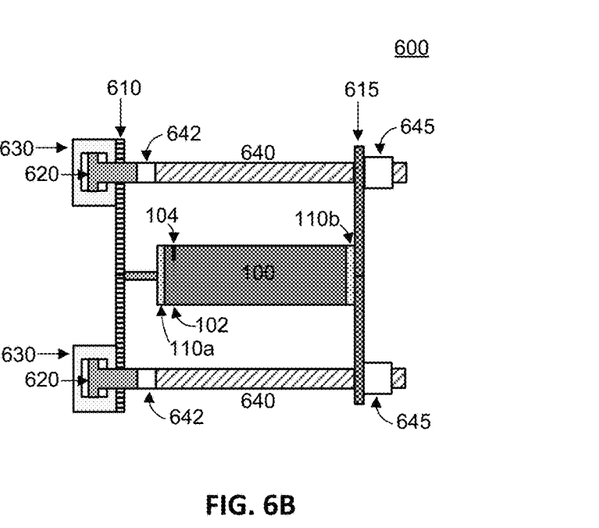

FIGS. 6A and 6B illustrates an exemplary system 600 for cleaving a work piece 100 through the use of capacitive clamps 110 with multiple hydraulic cylinders, multiple screws and a single frame, according to one embodiment. FIG. 6A illustrates a front view of system 600, while FIG. 6B illustrates a side view of the system 600. System 600 has a frame with a fixed portion 610 and a moveable portion 615. In some embodiments, the fixed portion 610 and moveable portion 615 of the frame are "X" shaped. System 600 also uses multiple screws 640 and multiple hydraulic cylinders that are formed by the cylinders 630 and rods 620. The screws 640 may be any type of screw that functions in the manner described. For example, the screws 640 may be lead screws. The cylinders 630 are attached to the fixed portion of the frame 610. The cylinders 630 couple with rods 620 that are attached to one end of the screws 640 by thrust bearings 642 that allow the screws 640 to rotate without applying torque to the fixed portion of the frame 610. The other end of the screws 640 are coupled to the moveable portion of the frame 615 by reciprocal nuts 645 that are fixed to the moveable portion of the frame 615, as is described in conjunction with system 400 of FIG. 4. Capacitive clamps 110a and 110b are attached to the fixed portion 610 and the moveable portion 615 of the frame, respectively. The hydraulic cylinders provide the tensile force 140 in the manner described with respect to system 400 of FIG. 4, while the screws 640 are held fixed so as to only transmit the load. As in system 400 of FIG. 4, the screws 640 are used to position the work piece 100 and are long enough to accommodate the length of the work piece 100.

Figure 7:
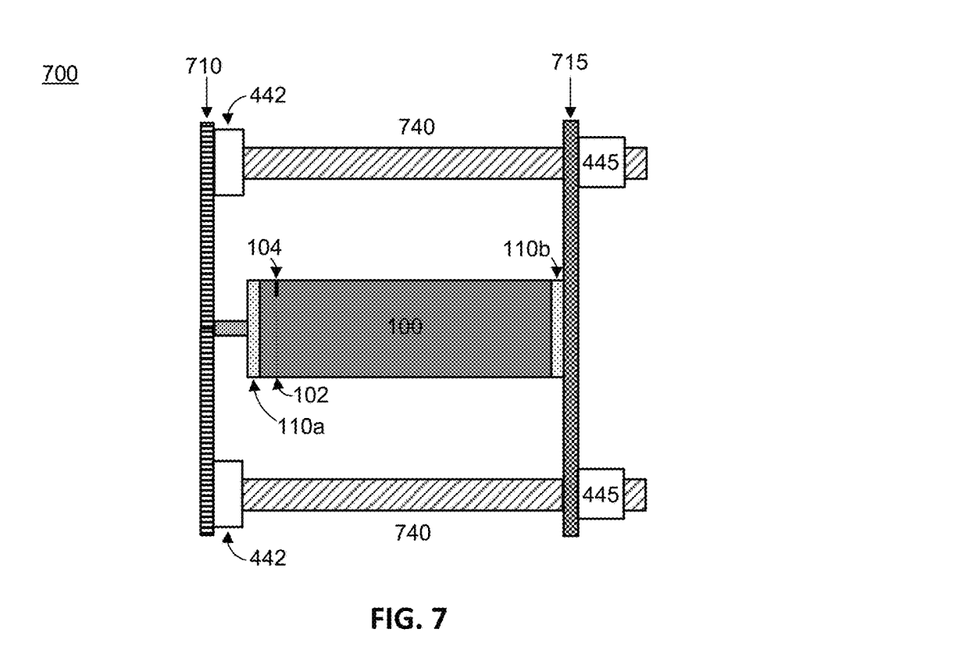
FIG. 7 illustrates a system for cleaving a work piece through the use of capacitive clamps with multiple screws and a single frame, according to one embodiment.

FIG. 7 illustrates an exemplary system 700 for cleaving a work piece 100 through the use of capacitive clamps 110 with multiple screws and a single frame, according to one embodiment. System 700 is similar to system 400 of FIG. 4, except without a hydraulic cylinder. Instead, the capacitive clamp 110a is fixed to the fixed portion of the frame 710, and the tensile force 140 is created by using the screws 740 to push the moveable portion of the frame 715 away from the fixed portion of the frame 710.

Figure 8:
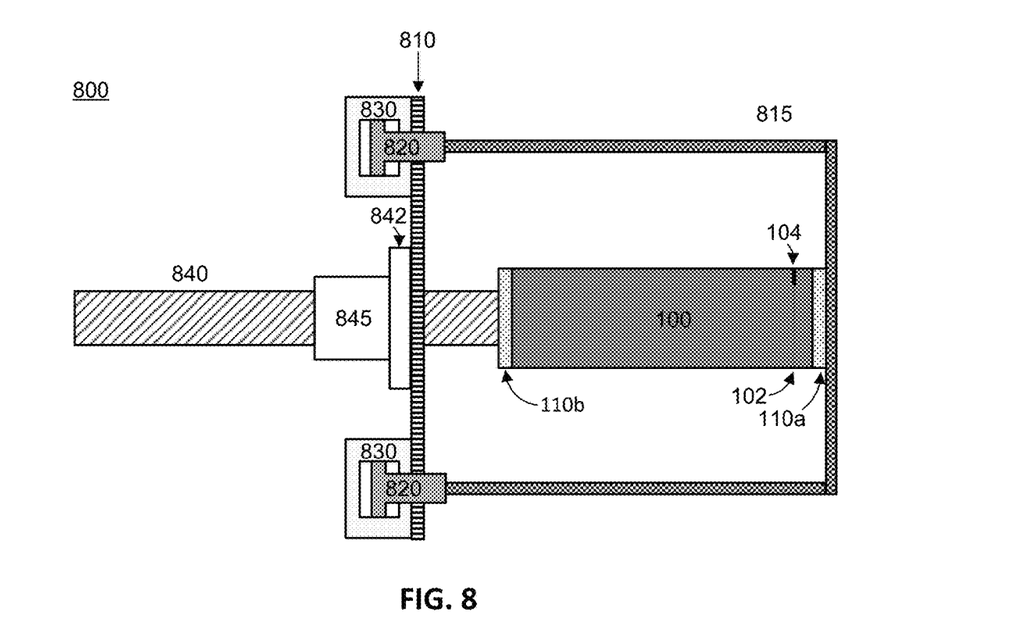
FIG. 8 illustrates a system for cleaving a work piece through the use of capacitive clamps with multiple hydraulic cylinders, a single screw and a single frame, according to one embodiment.

FIG. 8 illustrates an exemplary system 800 for cleaving a work piece 100 through the use of capacitive clamps 110 with multiple hydraulic cylinders, a single screw, and a single frame, according to one embodiment. In system 800, there is a frame that comprises a fixed portion 810 and a moveable portion 815. Cylinders 830 and a nut 845 are attached to the exterior side of the fixed portion of the frame 810. The cylinders 830 interface with rods 820 that are attached to the ends of the moveable portion of the frame 815. Together, the cylinders 830 and rods 820 form hydraulic cylinders. A capacitive clamp 110a is attached to the interior surface of a part of the moveable portion of the frame 815 that is parallel to the fixed portion of the frame 810. Another capacitive clamp 110b is attached to a lead screw 840 that couples with the nut 845. The screw 840 stays fixed to the capacitive clamp 110b and does not spin. Instead, the nut 845 is attached to the fixed portion of the frame 810 with a thrust bearing 842 that allows the nut 845 to rotate while still being securely attached to the fixed portion of the frame 810. Moving the nut 845 positions the work piece 100 as the cleaving process repeats by pushing the screw 840 and the capacitive clamp 110b toward the capacitive clamp 110a attached to the moveable portion of the frame 815. The tensile force 140 is created by the hydraulic cylinders in the same manner as the hydraulic cylinders in system 600 of FIG. 6.

Figure 9:
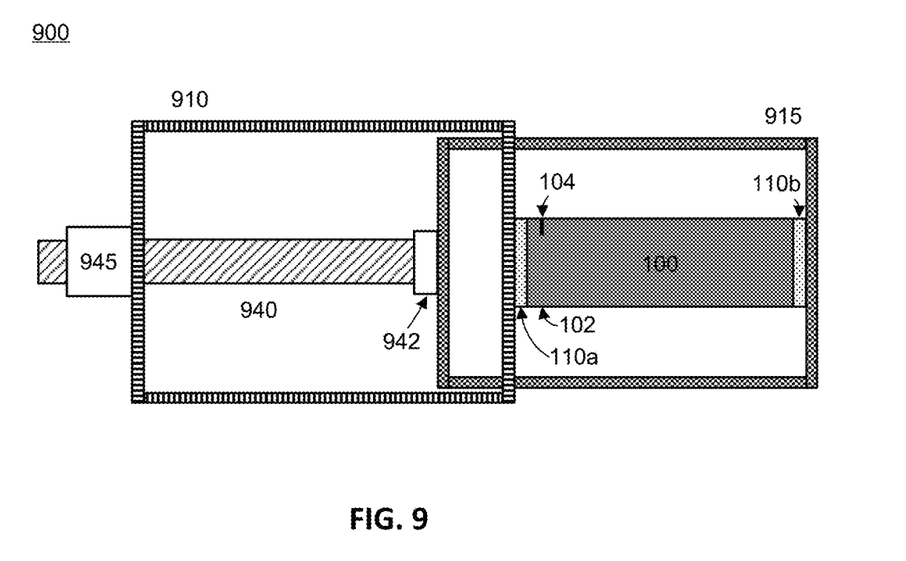
FIG. 9 illustrates a system for cleaving a work piece through the use of capacitive clamps with a single screw and two frames, according to one embodiment.

FIG. 9 illustrates an exemplary system 900 for cleaving a work piece 100 through the use of capacitive clamps 110 with a single screw and two frames, according to one embodiment. System 900 has one fixed frame 910 and one moveable frame 915. A capacitive clamp 110a is attached to the exterior of one side of the fixed frame 910, while a nut 945 is fixed to the exterior of the opposite side of the fixed frame 910. The nut 945 receives a reciprocal screw 940, much like in systems 400, 600 and 700 of FIGS. 4, 6, and 7. The screw 940 may be any type of screw that functions in the manner described. For example, the screw 940 may be a roller screw or ball screw. The screw 940 is secured to the exterior of one side of the moveable frame 915 with thrust bearings 942. A capacitive clamp 110b is secured to the interior of the opposite side of the moveable frame 915. The screw 940 is used to both apply the tensile force 140 by pushing the moveable frame 915 away from the fixed frame 910 and to position the work piece 100 after cleaving by pulling the moveable frame 915 back toward the fixed frame 910.

CONCLUSION

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A capacitive clamping system comprising:
   a first clamp adapted to fixedly receive a work piece having one or more cracks;
   a second clamp adapted to fixedly receive the work piece, the second clamp comprising:
      a conductive main body;
      a non-conductive layer attached to the face of the conductive main body, the non-conductive layer substantially flat for mating with the work piece; and
      a voltage source having a first lead coupled to the conductive main body of the second clamp and a second lead capable of being coupled to the work piece when fixed by the first clamp; and
   a tensile force generator mechanically coupled between the first clamp and the second clamp and adapted to apply a tensile force therebetween,
   wherein the voltage source is capable of applying a voltage sufficient to hold a portion of the work piece such that, when the tensile force generator is actuated to pull the work piece from the second clamp, a portion of the work piece is cleaved based on the location of the one or more cracks and remains on the second clamp.

2. The system of claim 1, wherein the first clamp comprises:
   a second conductive main body; and
   a second non-conductive layer attached to the face of the second conductive main body, the second non-conductive layer substantially flat for mating with the work piece;
   wherein the voltage source comprises a third lead capable of being coupled to the second conductive main body of the first clamp.

3. The system of claim 1, wherein the non-conductive layer of the second clamp comprises a material selected from a group consisting of: diamond, cubic boron nitride, aluminum nitride, hafnium oxide, silicon oxide, silicon nitride, barium titanate, strontium titanate, lithium niobate, aluminum oxide, calcium fluoride, silicon carbide, and any combination thereof.

4. The system of claim 1, wherein the conductive main body of the second clamp comprises a semiconducting material.

5. The system of claim 1, wherein the conductive main body of the second clamp is cylindrical.

6. The system of claim 1, wherein the conductive main body is attached to a conductive support using a non-conductive material that prevents charge from moving between the conductive main body and the support.

7. The system of claim 6, wherein the non-conductive material is non-conductive epoxy.

8. The system of claim 1, wherein the tensile force generator comprises one or more hydraulic cylinders.

9. The system of claim 1, wherein the tensile force generator comprises one or more screws.

10. The system of claim 1, further comprising a removal mechanism that removes the cleaved work piece from the second clamp.

11. The system of claim 10, further comprising a collector positioned proximate to the second clamp and the removal mechanism such that the cleaved work piece can be caught and moved away from the second clamp.

12. The system of claim 1, further comprising a positioning mechanism that moves the work piece closer to the second clamp after a cleaved piece has been removed, such that the work piece can be secured to the second clamp.

13. A method for cleaving material, the method comprising:
   securing a first end of a work piece with a first clamp;
   securing a second end of the work piece with a second clamp using an attractive electrostatic force between the second clamp and the work piece;
   introducing one or more cracks to a side surface of the work piece, the side surface connecting the first end and the second end of the work piece; and
   applying a tensile force to the work piece between the first and second clamps, the tensile force causing the one or more cracks to propagate through the work piece such that a portion of the work piece is cleaved based on the location of the one or more cracks and remains on the second clamp.

14. The method of claim 13, wherein the work piece comprises a semiconducting material.

15. The method of claim 14, wherein the semiconducting material is silicon, and the cleaved work piece is a silicon wafer.

16. The method of claim 13, wherein the work piece comprises an insulating material.

17. The method of claim 16, wherein the work piece is coated with a layer of a conductive material that is bonded to the surface of the insulating material such that the conductive material is not removed when the tensile force is applied.

18. The method of claim 13, wherein the work piece is made of a crystalline material.

19. The method of claim 13, wherein the work piece has a substantially circular cross-section.

20. The method of claim 13, wherein the work piece has a pseudo-square cross-section.

21. The method of claim 20, wherein the pseudo-square cross-section has a side length of 156 millimeters.

22. The method of claim 20, wherein the pseudo-square cross-section has a side length of 125 millimeters.

23. The method of claim 13, wherein the second clamp comprises a material selected from a group consisting of: diamond, cubic boron nitride, aluminum nitride, hafnium oxide, silicon oxide, silicon nitride, barium titanate, strontium titanate, lithium niobate, aluminum oxide, calcium fluoride, silicon carbide, and any combination thereof.

24. The method of claim 13, wherein the second clamp comprises a semiconducting material.

25. The method of claim 13, wherein the one or more cracks are introduced after the work piece is secured by the first clamp and the second clamp.

26. The method of claim 13, wherein the second end of the work piece has a flat face and the one or more cracks are in a plane that is substantially parallel to the flat face.

27. The method of claim 13, wherein the work piece has multiple cracks at different lengths along an axis of the work piece.

28. The method of claim 27, wherein the multiple cracks are of different depths.

29. The method of claim 13, further comprising:
removing the cleaved work piece from the second clamp.

30. The method of claim 29, wherein removing the cleaved work piece comprises creating a repulsive electrostatic force between the cleaved work piece and the second clamp.

31. The method of claim 29, further comprising:
moving the work piece toward the second clamp such that a cleaved end of the work piece can be secured to the second clamp;
introducing one or more cracks to a side surface of the work piece, the side surface connecting the first end and the cleaved end of the work piece; and
applying a tensile force to the work piece between the first and second clamps, the tensile force causing the one or more cracks to propagate through the work piece such that a portion of the work piece is cleaved based on the location of the one or more cracks and remains on the second clamp.

* * * * *

UNITED STATES PATENT AND TRADEMARK OFFICE
CERTIFICATE OF CORRECTION

PATENT NO. : 9,718,215 B2  
APPLICATION NO. : 14/687819  
DATED : August 1, 2017  
INVENTOR(S) : Andrew Bollman et al.

Page 1 of 1

It is certified that error appears in the above-identified patent and that said Letters Patent is hereby corrected as shown below:

Column 11, Line 35, Claim 1 after "layer attached to," delete "a" and insert --the--.

Column 11, Line 54, Claim 2 after "layer attached to," delete "a" and insert --the--.

Signed and Sealed this  
Thirty-first Day of July, 2018

Andrei Iancu  
*Director of the United States Patent and Trademark Office*